United States Patent

[19] Maruyama

[11] Patent Number: 6,061,160
[45] Date of Patent: May 9, 2000

[54] COMPONENT DEVICE FOR OPTICAL COMMUNICATION

[75] Inventor: Tsukasa Maruyama, Akita, Japan

[73] Assignee: Dowa Mining Co., Ltd., Tokyo, Japan

[21] Appl. No.: 08/865,735

[22] Filed: May 30, 1997

[30] Foreign Application Priority Data

May 31, 1996 [JP] Japan .................................. 8-160696

[51] Int. Cl.$^7$ .................................................. H04B 10/00
[52] U.S. Cl. ........................... 359/152; 313/512; 362/800
[58] Field of Search ..................................... 359/152, 180,
359/189, 193; 313/512, 113; 362/800, 253,
327, 329

[56] References Cited

U.S. PATENT DOCUMENTS

| | | | |
|---|---|---|---|
| 4,013,915 | 3/1977 | Dufft | 313/512 X |
| 4,941,072 | 7/1990 | Yasumoto et al. | 362/800 X |
| 4,964,025 | 10/1990 | Smith | 362/800 X |
| 5,001,609 | 3/1991 | Gardner et al. | 362/800 X |
| 5,122,943 | 6/1992 | Pugh | 362/800 X |
| 5,289,082 | 2/1994 | Komoto | 313/512 X |
| 5,865,529 | 2/1999 | Yan | 313/512 X |

*Primary Examiner*—Thomas Mullen
*Attorney, Agent, or Firm*—Frishauf, Holtz, Goodman, Langer & Chick, P.C.

[57] ABSTRACT

A component device for optical communication comprising a reflector and a lens. The reflector is in the form of a deep dish with a height B of 0.2–0.4 mm, a bottom diameter A of 0.7–1.1 mm and the side wall having an angle C of 40–85 degrees. The lens is a hemisphere formed on the reflector, with the apex distant from the bottom surface of the reflector by a height D of 4.5–5.0 mm. The hemisphere has a radius R of 2.4–2.8 mm. A thin miniature lamp is provided that is improved in leadframe design such that the advantages of the conventional 5 mm$^\Phi$ are retained, while its height is reduced to less than 5.5 mm. In addition, it is capable of achieving an effective luminous intensity distribution pattern of a light beam, which is one of the major characteristics required in data communication.

14 Claims, 5 Drawing Sheets

COMPONENT DEVICE FOR OPTICAL COMMUNICATION

BACKGROUND OF THE INVENTION

1. Field of the Invention

This invention relates to a component device for optical communication, more particularly, to a component device for optical communication that has a reflector for either emitting or receiving the light to be used in optical communication. Stated more specifically, the invention relates to a lamp that has the optical characteristics necessary for IR data transmission in the space, that can be mounted on a substrate surface and that is thin with a diameter of 5 mm.

2. Background Information

Remote controls as an accessory to TV receivers use IR lamps with a diameter of 3 mm or 5 mm to perform IR carried data transmission in the space. The use of these IR lamps is increasing today. Particularly in the case of performing data communication with computer's peripheral equipment through the space, the increasing reduction in the size of the peripheral equipment has motivated the installation of IR lamps of a smaller size and a greater radiant intensity on the computer.

FIG. 9 shows a prior art case of IR lamp installation on a circuit board 95 on which the lamp 96 is mounted. In the case of a 3 mm$^\Phi$ lamp, its height is as small as 5.3 mm but, at the same time, the lamp diameter is so small (3 mm) that the optical axis of the lamp will be offset during assembly which, in turn, will cause an angular offset during optical communication.

In the case of a 5 mm$^\Phi$ lamp, the scattering in assembly is comparatively small and will not cause any great offset in the optical axis of the lamp; in addition, the focusing of light by the lamp is so efficient that it is capable of producing high radiant intensity. On the other hand, the height of the lamp exceeds 7 mm, which has been a bottleneck in the effort to realize a compact device.

The primary reason for this problem will be apparent from FIG. 10, in which a light-emitting diode (LED) 92 is shown to be carried on a leadframe 93. In high-volume production of the device, the leadframe 93 has to be embedded in the lens portion 91 of the lamp 94 in order to fix the leadframe in position. This inevitably increases the axial length of the lamp 94.

It is conventional to reduce the height of the lamp 94 by using a leadframe in a thin plate form. However, thin miniature lamps that have the necessary characteristics to meet the requirements for data communication with the computer's peripheral equipment are too costly to warrant their widespread use.

SUMMARY OF THE INVENTION

The present invention has been accomplished in order to solve these problems of the prior art. To repeat, the conventional 5 mm$^\Phi$ high-power lamp for use in data communication has a height exceeding 7 mm and this has been a bottleneck in the effort to reduce the overall size of the device on which the lamp is installed. According to the invention, the diameter of the lamp remains 5 mm but its height is reduced below 5.5 mm to thereby realize a compact device.

An object, therefore, of the present invention is to provide a thin miniature lamp which is improved in leadframe design such that the advantages of the conventional 5 mm$^\Phi$ lamp are retained while its height is reduced to less than 5.5 mm and which, in addition, is capable of achieving an effective luminous intensity distribution pattern of a light beam which is one of the major characteristics required in data communication.

As a result of the intensive studies conducted in order to attain the stated object, the present inventors found that a desired half beam angle for high directivity of a light beam could be obtained with a design in which a lens with a diameter of 5 mm was placed on a reflector-equipped leadframe as they were spaced apart by a specified distance and in which the dimensions of the reflector and the lens were specified to satisfy a specified relationship with the installation distance. The present invention has been accomplished on the basis of this finding.

The stated object of the invention can be attained by a component device for optical communication which comprises a reflector and a lens, said reflector being in the form of a deep dish with a height B of 0.2–0.4 mm, a bottom diameter A of 0.7–1.1 mm and the side wall having an angle C of 40–85 degrees, and said lens being a hemisphere formed on the reflector, with the apex distant from the bottom surface of said reflector by a height D of 4.5–5.0 mm and said hemisphere having a radius R of 2.4–2.8 mm.

In a preferred embodiment, the diameter A is 0.75±0.03 mm, the height B is 0.3±0.03 mm, the angle C is 80±2 degrees, the height D is 4.8±0.05 mm, and the radius R is 2.5±0.05 mm.

In a more preferred embodiment, the diameter A is 1.0±0.03 mm, the height B is 0.3±0.03 mm, the angle C is 45±2 degrees, the height D is 4.6±0.05 mm, and the radius R is 2.7±0.05 mm.

The component device of the invention may have light-emitting means provided on the inner surface of the bottom of the reflector. Alternatively, the device component may have light-receiving means provided on the inner surface of the bottom of the reflector.

DETAILED DESCRIPTION OF THE INVENTION

In a typical case of the invention, a lens 1 is molded of a resin as an integral part of a leadframe 3. The distance D from the apex of the lens to the bottom surface of the reflector is typically 4.6–4.8 mm and, although a resin thickness of about 0.7 mm is usually required in the monolithic molding, the overall height of the lamp can be reduced to no more than 5.3–5.5 mm.

Figure 1:
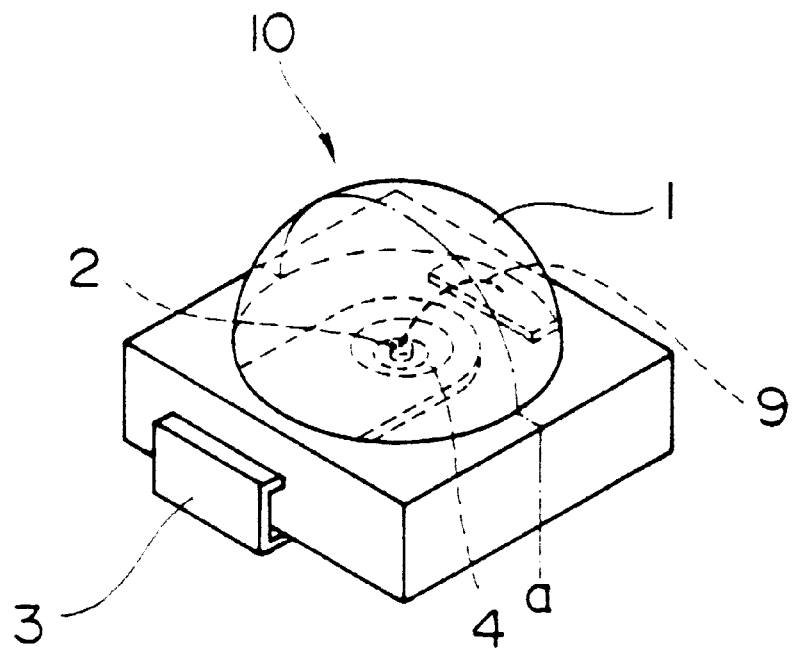
FIG. 1 is a perspective view showing a first embodiment of the invention.
Figure 2:
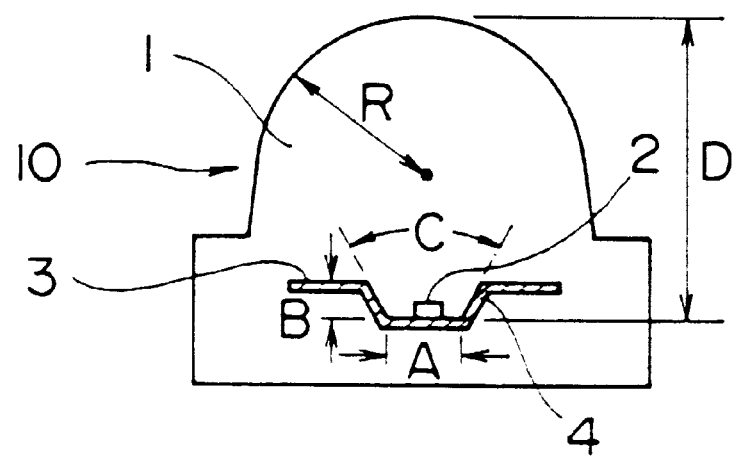
FIG. 2 is a section taken on line a of FIG. 1.

Several embodiments of the invention will now be described with reference to the accompanying drawings, in which FIG. 1 is a perspective view showing a first embodiment of the invention, and FIG. 2 is a section taken on line a of FIG. 1.

Figure 3:
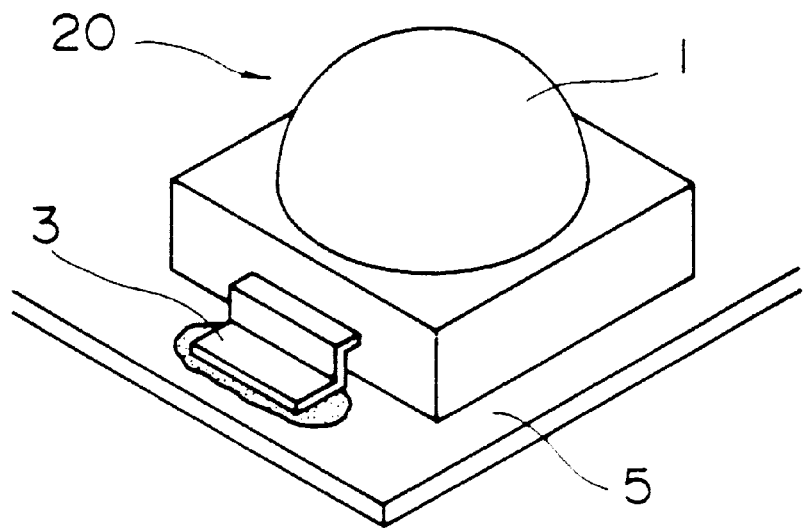
FIG. 3 is a perspective view showing a second embodiment of the invention.
Figure 4:
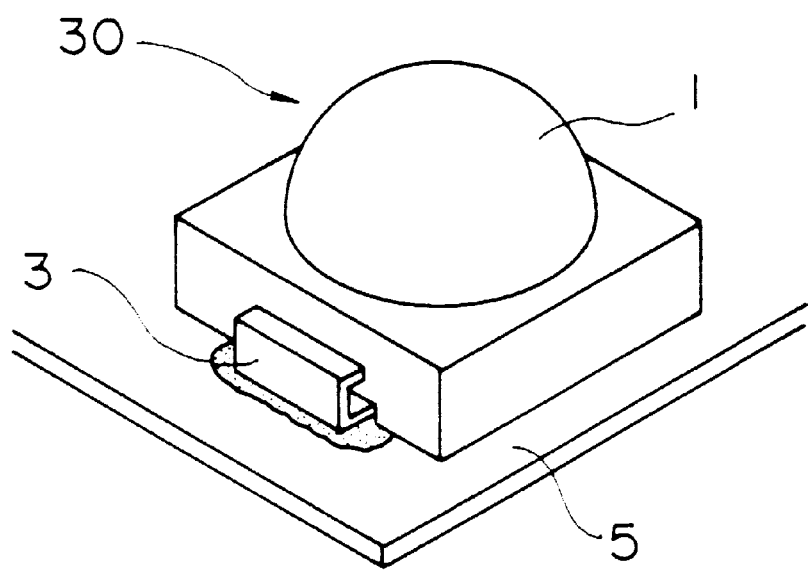
FIG. 4 is a perspective view showing a third embodiment of the invention.
Figure 5:
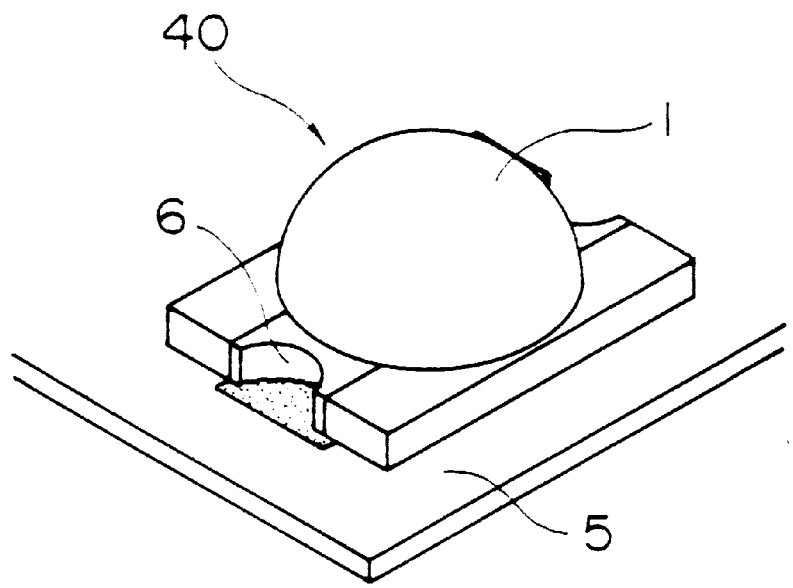
FIG. 5 is a perspective view showing a fourth embodiment of the invention.
Figure 6:
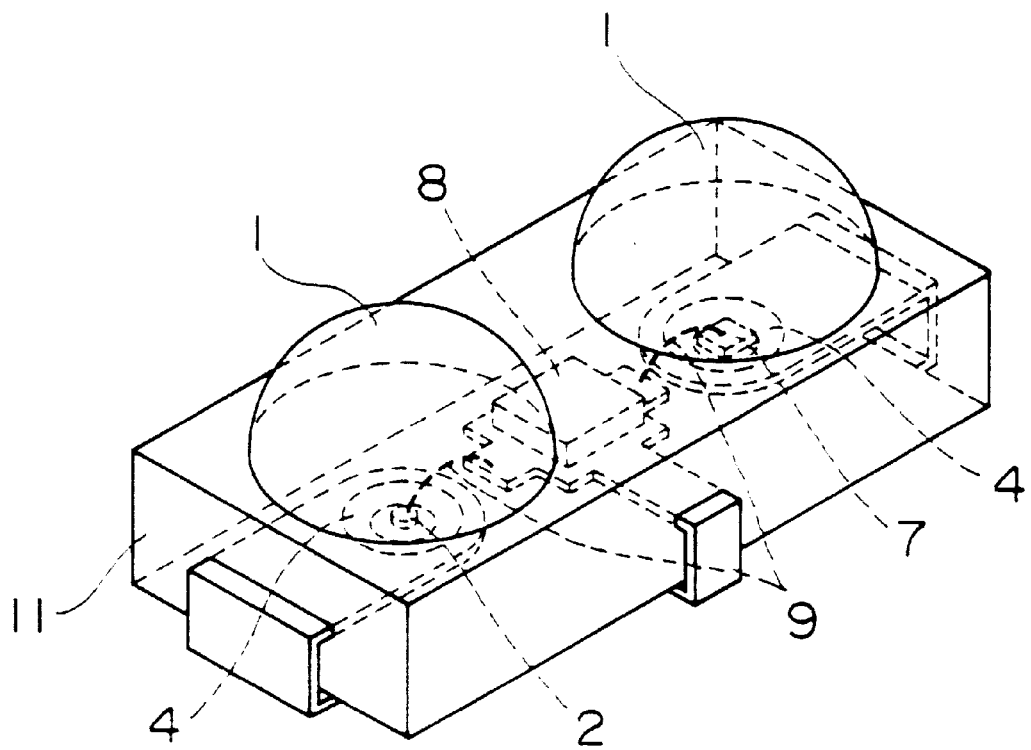
FIG. 6 is a perspective view showing a fifth embodiment of the invention.

FIG. 3 is a perspective view showing a second embodiment of the invention; FIG. 4 is a perspective view showing a third embodiment of the invention; FIG. 5 is a perspective view showing a fourth embodiment the invention and FIG. 6 is a perspective view showing a fifth embodiment of the invention.

Figure 7:
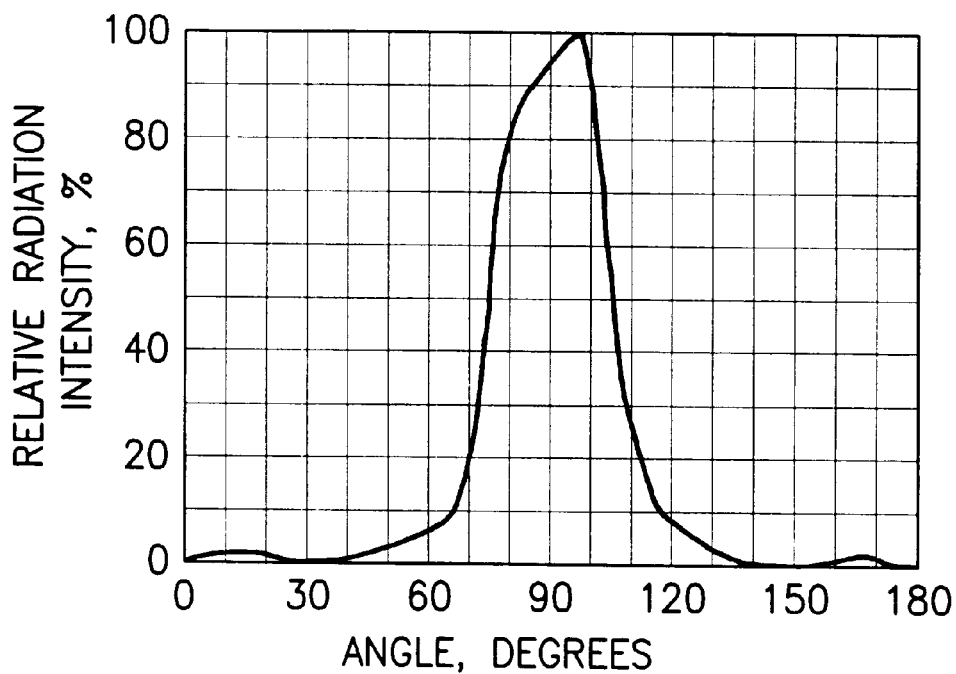
FIG. 7 shows a luminous intensity distribution pattern which is produced in an example of the invention.
Figure 8:
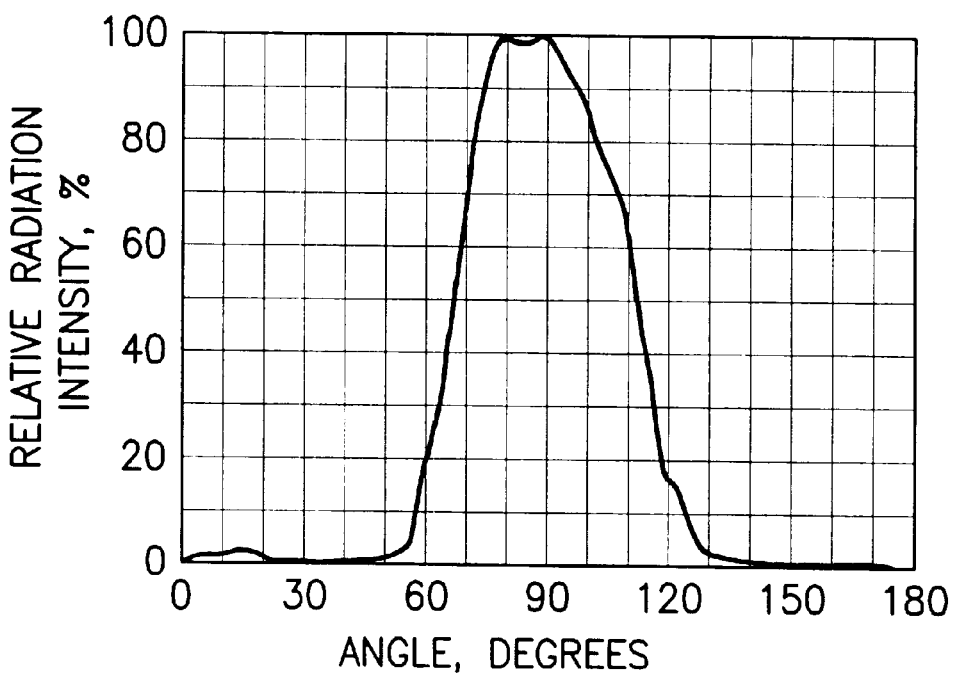
FIG. 8 shows a luminous intensity distribution pattern that is produced in another example of the invention.

FIG. 7 shows a luminous intensity distribution pattern that was produced in an example of the invention; and FIG. 8 shows a luminous intensity distribution pattern that was produced in another example of the invention.

FIG. 1 shows schematically the structure of a lamp according to a first embodiment of the invention. The lamp generally indicated by 10 comprises a leadframe 3, a reflector 4 in the form of a deep dish that is carried on the leadframe 3, an LED 2 that is fitted in the reflector 4 as a light source, and a hemispherical lens 1 with a diameter of 5 mm that is placed over the LED 2 with a predetermined spacing.

The positions in which the reflector 4, LED 2 and lens 1 are mounted with respect to the leadframe 3 will now be described by particular reference to FIG. 2. The leadframe 3 is provided at the inner end with the reflector 4 in the form of a deep dish that has a bottom diameter A, a height B and the side wall having a flare angle of C. The reflector 4 collects the light issuing from the LED 2 which is light-emitting means and projects it forward (upward in FIG. 2) to strike the inner surface of the lens 1. Needless to say, the LED 2 is bonded to the center of the bottom surface of the reflector 4 and it must be provided with a wiring 9 to permit current application.

The lens 1 having a radius of R is formed over the reflector 4. The apex of the lens 1 is distant from the bottom surface of the reflector 4 by a height of D. If a desired half beam angle of a light beam is determined, the leadframe 3, reflector 4, lens 1 and LED 2 are provided in the manner just described above so as to satisfy the specified requirements of size, position and distance, thereby fabricating the lamp 10.

As already mentioned, the lens 1 is usually molded of a resin as an integral part of the leadframe 3. In a typical case, the distance D from the apex of the lens 1 to the bottom surface of the reflector 4 is 4.6–4.8 mm and, although a resin thickness of about 0.7 m is usually required in the monolithic molding, the overall height of the lamp 10 can be reduced to no more than 5.3–5.5 mm.

If the lens 1 has a radius R greater than 2.5 mm, its periphery may be trimmed to provide a diameter of 5 mm without causing any effect on the half beam angle of the luminous intensity distribution pattern obtained with the resulting lamp.

Figure 9:
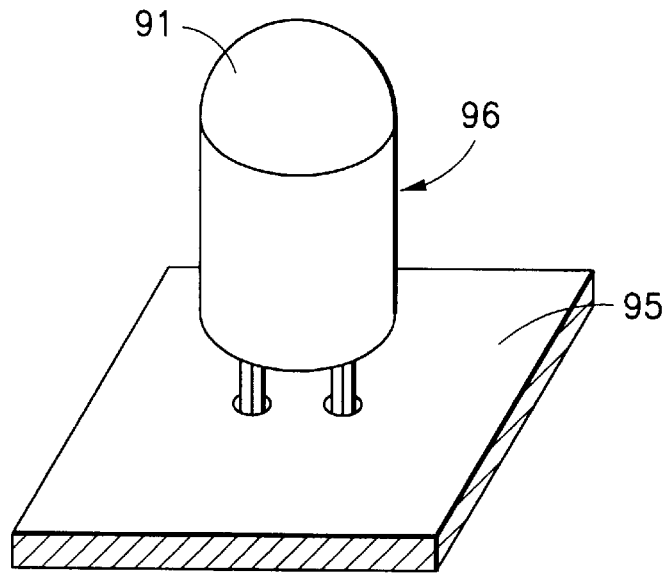
FIG. 9 is a perspective view showing how an IR lamp is mounted on a circuit board in a prior art case.
Figure 10:
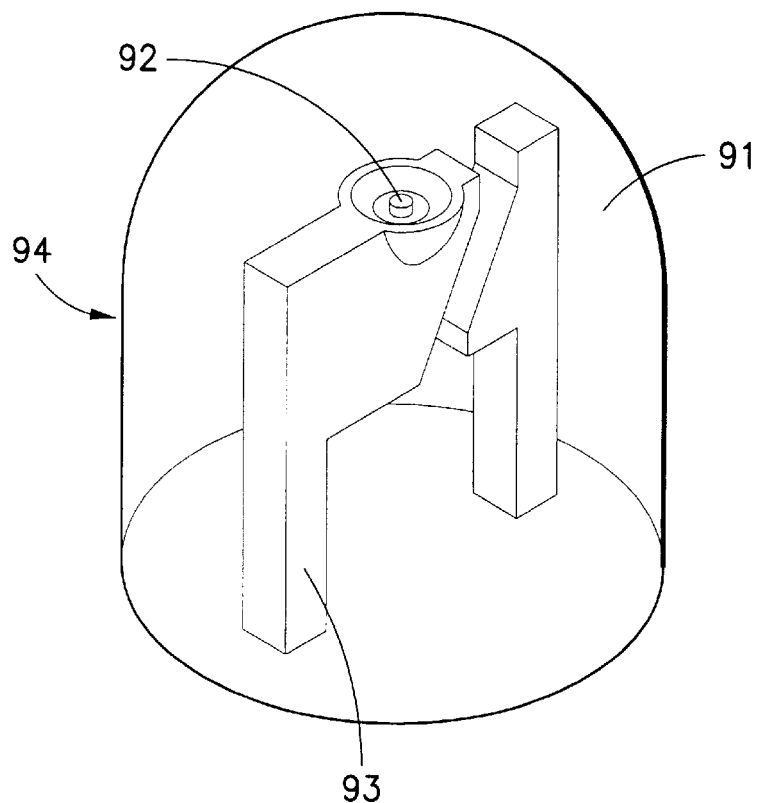
FIG. 10 is a perspective view showing another prior art case in which a leadframe is embedded in the lens portion of an IR lamp.

FIG. 3 shows a second embodiment of the invention, in which a thin leadframe 3 is bent outward of a lamp 20 to be face-mounted on a circuit board 5. Obviously, the lamp 20 can be mounted on the board 5 at a lower position than in the prior art case shown in FIG. 9. FIG. 4 shows a third embodiment of the invention, in which a thin leadframe 3 is bent inward of a lamp 30. Unlike in the case shown in FIG. 3, the leadframe 3 does not substantially protrude beyond the lamp 30, so the lamp size can be further reduced for surface mounting on the circuit board 5. FIG. 5 shows a fourth embodiment of the invention, in which through-hole electrodes 6 are formed to fabricate a lamp 40 which is even smaller in size than the versions shown in FIGS. 3 and 4.

FIG. 6 shows a fifth embodiment of the invention, in which two reflectors 4 and two lenses 1 in accordance with the invention are provided in selected areas of a comparatively thick substrate 11 and which additionally incorporates a light-receiving device 7 and a drive circuit 8 for operating the overall device. These elements are molded of a resin to fabricate a kind of "integrated circuit" device which is more compact than the aforementioned versions.

Needless to say, the LED 2 serving as a light source may be replaced by fiber optics. It also goes without saying that the LED 2 may be replaced by a light-receiving device to fabricate a lamp that can be used as a light-receiving sensor having a specified reception angle.

The present invention will now be described in greater detail with reference to actual working examples. In each example, the lamp was made on a press mold by transfer molding. The lamp 10 and the lens 1 were formed of a clear epoxy resin. The leadframe 3 was an iron alloy substrate 0.15 mm thick that was plated with a nickel primer coat (1 $\mu$m) which, in turn, was plated with a silver coat (2 $\mu$m).

The LED 2 was an IR (880 nm) emitting diode having a response speed of 12 MHz and producing an optical output power of 2.5 mW. The LED 2 was square in cross section with a length of 310 $\mu$m on one side and a height of 160 $\mu$m; an electrode with a diameter of 140 $\mu$m was attached to top of the LED 2 and wire bonded by a gold wire having a diameter of 25 $\mu$m.

(I) A lamp was fabricated in the shape indicated by 30 in FIG. 4 and its design parameters shown in FIG. 2 were as follows: A=0.75±0.03 mm, B=0.3±0.03 mm; C=80±2 degrees; D=4.8±0.05 mm; and R=2.5±0.05 mm. The lamp was found to have the luminous intensity distribution pattern shown in FIG. 7. The horizontal axis of the graph in FIG. 7 plots the angle in degrees and the vertical axis plots the relative radiant intensity. The optical axis of the lamp 30 corresponds to 90 degrees. Namely, optical axis is corresponding to 90 degrees.

According to the pattern shown in FIG. 7, light having a relative radiation intensity of 50% or more is attained in an angular range of 75–105 degrees. This corresponds to a half beam angle range of ±15 degrees, with the front of the lamp taken in the position at 90 degrees, and the characteristics required for data communication are well satisfied.

(II) Another lamp was fabricated in the shape indicated by 30 in FIG. 4 and its design parameters shown in FIG. 2 were as follows: A=1.0±0.03 mm, B=0.3±0.03 mm; C=45±2 degrees; D=4.6±0.05 mm; and R=2.7±0.05 mm. The lamp was found to have the luminous intensity distribution pattern shown in FIG. 8.

According to the pattern shown in FIG. 8, light having a relative radiant intensity of 50% or more is attained in an angular range of 67–113 degrees. This corresponds to a half beam angle range of ±23 degrees, with the front of the lamp taken in the position at 90 degrees, and the characteristics required for data communication are well satisfied.

The lens and lamp are preferably formed of epoxy resin having a refractive index "n" of 1.5±0.3. Suitable epoxy resins are available from Sumitomo Bakelite Co., Ltd. (product number ECR-7217); High Soul (phonetic) Co., Ltd. (HL8800) and Nitto Denko Corp. (the NT8500 series including NT8506).

As described on the foregoing pages, an unconventionally thin ($\leq$5.5 mm in height) lamp with a diameter of 5 mm can be fabricated by combining a reflector and a lens in such a way as to satisfy the specified shape, size, angle and distance requirements and this offers the great advantage of realizing significant reduction in the size of equipment for optical communication. In addition, the invention device provides a luminous intensity distribution pattern useful to the equipment for optical communication.

If the reflector and the lens according to the invention are molded of a resin together with a light-emitting device, a light-receiving device and a drive circuit for operating them, a kind of "integrated circuit" apparatus is realized, which contributes to further reduction in the overall size of the device.

What is claimed is:

1. A component device for optical communication which comprises a reflector and a lens, said reflector being in the form of a deep dish with a height B of 0.2–0.4 mm, a bottom diameter A of 0.7–1.1 mm and the side wall having an angle C of 40–85 degrees, and said lens being a hemisphere formed on the reflector, with the apex distant from the bottom surface of said reflector by a height D of 4.5–5.0 mm and said hemisphere having a radius R of 2.4–2.8 mm.

2. A component device according to claim 1, wherein the lens is formed from an epoxy resin.

3. A component device according to claim 2, wherein the epoxy resin has a refractive index of 1.5±0.3.

4. A component device according to claim 1, having a height below 5.5 mm.

5. A component device according to claim 1, wherein the diameter A is 0.75±0.03 mm, the height B is 0.3±0.03 mm, the angle C is 80±2 degrees, the height D is 4.8±0.05 mm, and the radius R is 2.5±0.05 mm.

6. A component device according to claim 5, which has light-emitting means provided on the inner surface of the bottom of said reflector.

7. A component device according to claim 5, which has light-receiving means provided on the inner surface of the bottom of said reflector.

8. A component device according to claim 5, wherein the component device provides for light having a relative radiation intensity of 50% or more being attained in an angular range of 75 to 105 degrees.

9. A component device according to claim 1, wherein the diameter A is 1.0±0.03 mm, the height B is 0.3±0.03 mm, the angle C is 45±2 degrees, the height D is 4.6±0.05 mm, and the radius R is 2.7±0.05 mm.

10. A component device according to claim 9, which has light-emitting means provided on the inner surface of the bottom of said reflector.

11. A component device according to claim 9, which has light-receiving means provided on the inner surface of the bottom of said reflector.

12. A component device according to claim 9, wherein the component device provides for light having a relative radiation intensity of 50% or more being attained in an angular range of 67 to 113 degrees.

13. A component device according to claim 1, which has light-emitting means provided on the inner surface of the bottom of said reflector.

14. A component device according to claim 1, which has light-receiving means provided on the inner surface of the bottom of said reflector.

* * * * *